(12) United States Patent
Au et al.

(10) Patent No.: US 8,009,785 B2
(45) Date of Patent: Aug. 30, 2011

(54) METHOD AND SYSTEM FOR IMPLEMENTING A PLL USING HIGH-VOLTAGE SWITCHES AND REGULATORS

(75) Inventors: Stephen Au, San Diego, CA (US); Dandan Li, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 999 days.

(21) Appl. No.: 11/867,310

(22) Filed: Oct. 4, 2007

(65) Prior Publication Data
US 2009/0067478 A1 Mar. 12, 2009

Related U.S. Application Data

(60) Provisional application No. 60/971,226, filed on Sep. 10, 2007.

(51) Int. Cl.
*H04L 7/00* (2006.01)
(52) U.S. Cl. ........ 375/371; 375/375; 375/376; 327/148; 327/157

(58) Field of Classification Search ............... 375/371, 375/373–376; 327/147, 148, 150, 156, 157
See application file for complete search history.

(56) References Cited

U.S. PATENT DOCUMENTS

| 5,202,587 | A * | 4/1993 | McLaury | 327/536 |
| 6,597,217 | B2 * | 7/2003 | Ingino, Jr. | 327/157 |
| 6,747,494 | B2 * | 6/2004 | Bushey et al. | 327/148 |
| 7,742,554 | B2 * | 6/2010 | Huang et al. | 375/376 |

* cited by examiner

*Primary Examiner* — Dac Ha
(74) *Attorney, Agent, or Firm* — Garlick Harrison & Markison; Bruce E. Garlick

(57) ABSTRACT

A method and apparatus in an integrated circuit radio transceiver are operable to apply a modified control signal to drive logic that includes a plurality of first devices having a first threshold voltage and a first gate oxide thickness that are both greater than a second threshold voltage and a second gate oxide thickness for a greater second plurality of devices within the integrated circuit radio transceiver. The transceiver therefore generates a first control signal having a first magnitude operable to drive logic that includes a plurality of devices having a second threshold voltage and applies the first control signal to a level shifter to produce the modified control signal.

20 Claims, 7 Drawing Sheets level shifter 174 and 178

METHOD AND SYSTEM FOR IMPLEMENTING A PLL USING HIGH-VOLTAGE SWITCHES AND REGULATORS

CROSS REFERENCE TO RELATED PATENTS

This U.S. application for patent claims the benefit of the filing date of U.S. Provisional Patent Application having Ser. No. 60/971,226 filed on Sep. 10, 2007, which is incorporated herein by reference for all purposes.

BACKGROUND

1. Technical Field

The present invention relates to wireless communications and, more particularly, to circuitry for wireless communications.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bi-polar circuitry, allowing for large signal swings and linear transmitter component behavior. Therefore, many legacy baseband processors employ analog interfaces that communicate analog signals to and from the radio processor.

As devices shrink in size to the deep-submicron level in CMOS technology, new challenges are created based upon the device physics. Accordingly, there is a need for identifying and addressing such new challenges.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
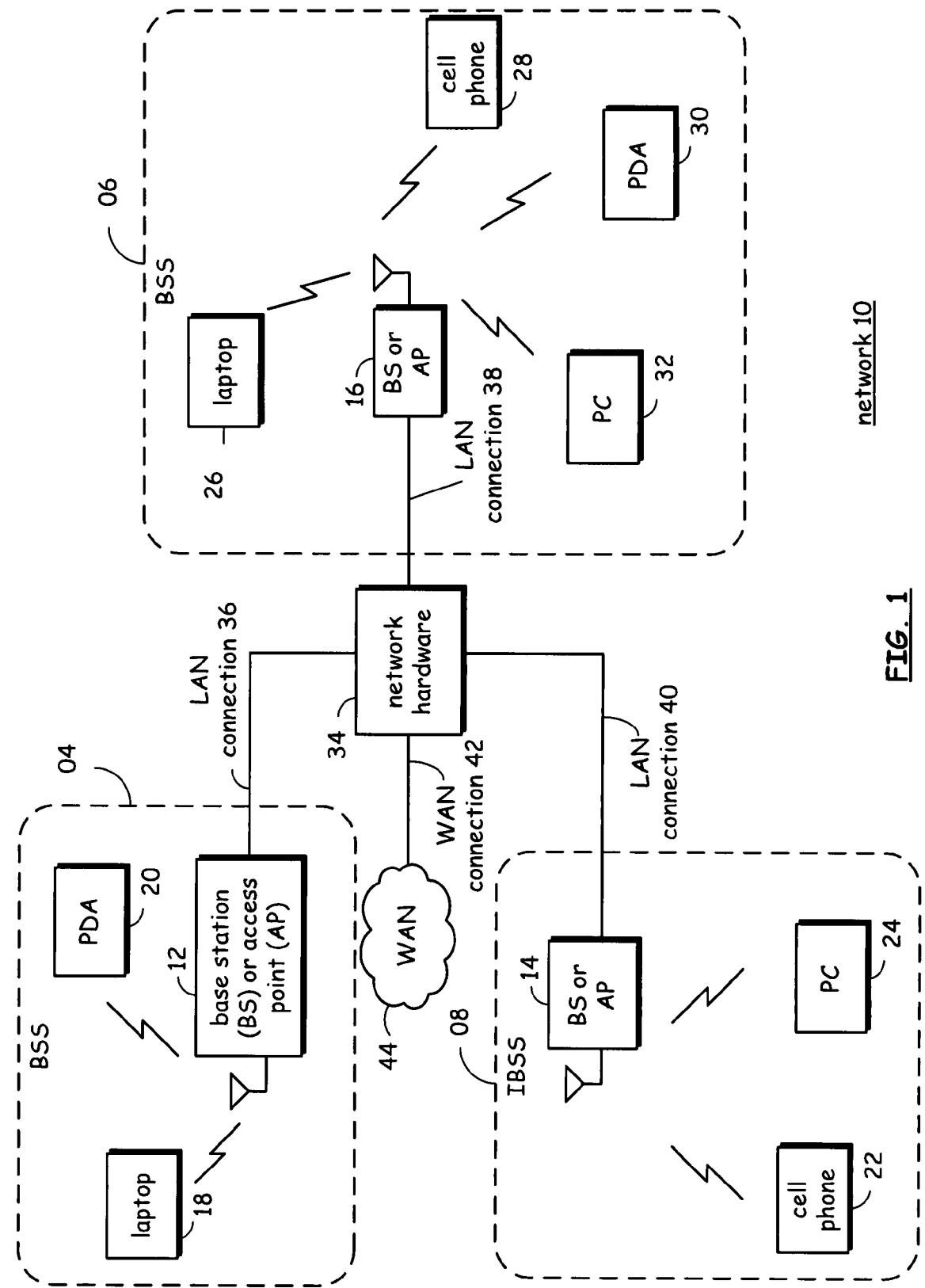
FIG. 1 is a schematic block diagram illustrating a wireless communication device that includes a host device and an associated radio.

FIG. 1 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-10.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
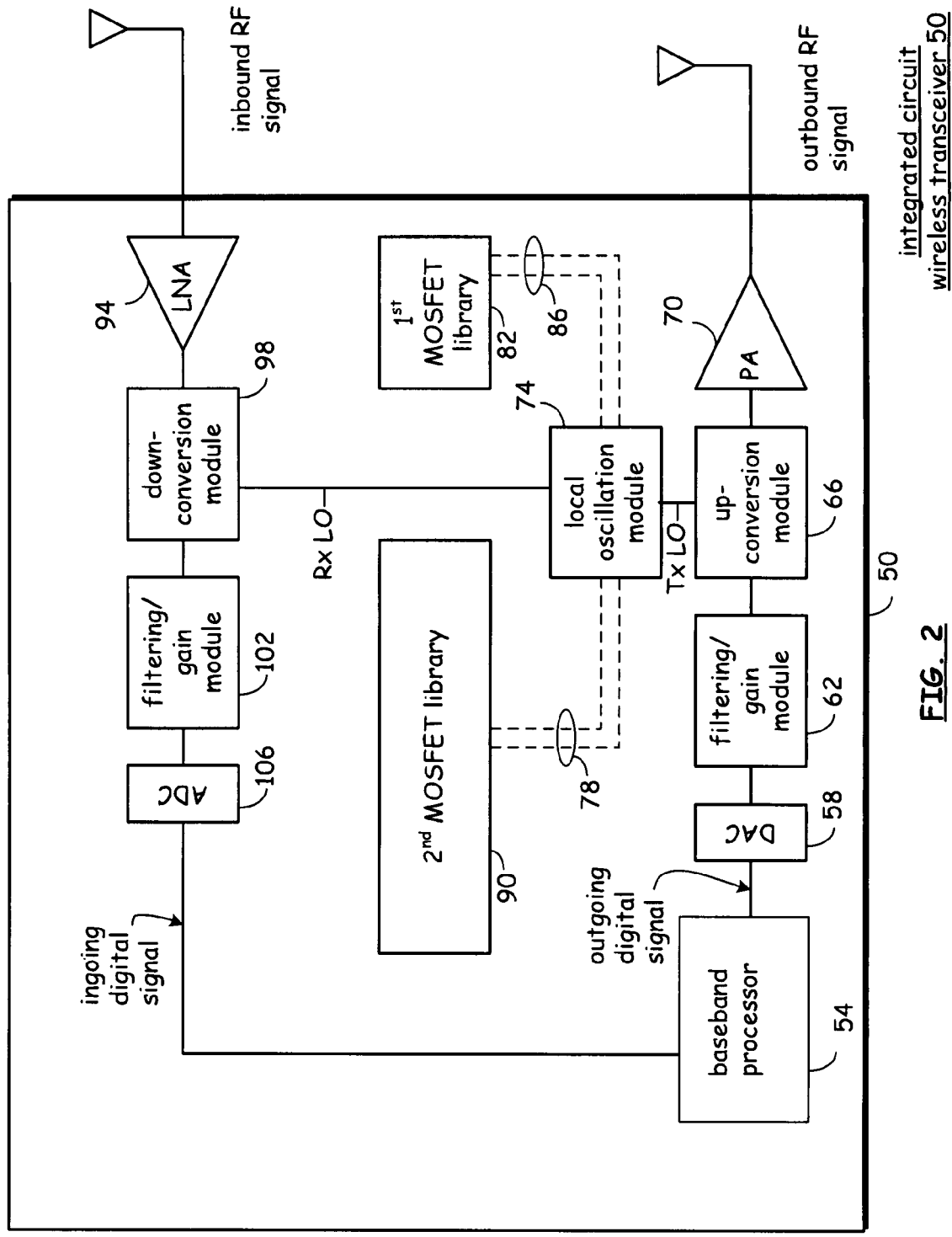
FIG. 2 is a schematic block diagram illustrating an integrated circuit wireless transceiver of a communication host device.

FIG. 2 is a schematic block diagram illustrating an integrated circuit wireless transceiver 50 of a communication host device 18-32. As illustrated, integrated circuit wireless transceiver 50 of communication host device 18-32 includes a processing module 54 (for example, a baseband processor), that is operably disposed to produce outgoing digital signals to an digital-to-analog (DAC) converter 58. The analog signal is produced therefrom to a filtering/gain module 62 which is operable to produce a filtered and/or amplified signal to an up-conversion module 66. Up-conversion module 66 produces a radio frequency (RF) signal to a power amplifier 70 for radiation from an antenna coupled to receive the amplified output from power amplifier 70 (either directly or by way of intermediate circuitry such as a transmit/receive selection switch). Up-conversion module 66 includes circuitry that operably upconverts the output of module 62 to a radio frequency based upon a transmit local oscillation produced by a local oscillation module 74.

In many deep-submicron CMOS technology, the normal thin-gate MOSFETs transistors are often leaky even when turned off due to their low threshold voltage and very thin gate oxide. In a transceiver circuit, for example, in a PLL (Phase-Locked Loop) which is often implemented within local oscillation module 74 of the described embodiment, this poses a serious problem as a significant leakage current at a charge-pump output and a VCO (voltage-controlled oscillator) control voltage node can create a large periodic ramp waveform, resulting in a large reference spur thereby adversely affecting communications and the ability accurate up-convert and down-convert outgoing and ingoing signals, respectively.

As may further be seen, local oscillation module 74 is further coupled by lines 78 to a first MOSFET library 82 and by lines 86 to a second MOSFET library 90. Lines 78 and/or 90 operably couple MOSFETs within libraries 82 and/or 90 to be a part of local oscillation circuitry such as local oscillation module 74. Local oscillation module 74 thus includes circuitry for adjusting the output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 66 and down-conversion module 98 are implemented to perform direct conversion between baseband and RF, it is understood that the principles herein may also be applied readily to systems that implement an intermediate frequency conversion step at a low intermediate frequency.

Generally, the integrated circuit wireless transceiver 50 is made of a substantially new fabrication process that produces component sizes of a specified dimension. For example, in a typical sub-micron process, MOSFET devices are formed in a library and all are characterized by a specified channel length. Current semiconductor fabrication processes may produce a library of MOSFETs having a 0.10 micron channel length or less. These MOSFETS are then used through out circuitry within the integrated circuit wireless transceiver.

Additionally, a lower magnitude supply voltage is typically produced to support operation of the circuitry that includes these MOSFET devices that won't overpower or damage the sub-micron circuitry. Thus, such MOSFETS are used within the various modules 58-74 and 94-106. One problem, however, is that such small channel devices typically exhibit higher gate leakage rates because the small scaling results in non-ideal operation (currents flow even in an "off" state). Accordingly, MOSFETS used within the local oscillation module 74 may sustain a leakage rate that substantially affects a local oscillation value or generates reference spurs.

Accordingly, one aspect of the embodiment of FIG. 2 is that local oscillation module 74 is operably disposed to utilize first MOSFET devices within the first MOSFET library 82 that have a much thicker oxide layer to produce substantially less gate leakage such that the leakage is within an acceptable amount, if it exists at all. Additionally, for circuitry that can tolerate the leakage, second MOSFET devices within the second MOSFET library 90 are operably disposed into connectivity with circuit elements of such circuitry. For example, in one embodiment, the second library 90 includes 0.065 micron devices while the first library 82 includes 0.28 micron devices which have substantially less leakage. For purposes of leakage intolerant circuitry, the first library 82 includes circuitry whose leakage is negligible or within an acceptable range.

As may also be seen, a low noise amplifier 94 is operably disposed to receive inbound RF signals received at an antenna to produce an amplified ingoing RF signal to down conversion module 98 that is also operably disposed to receive a receive local oscillation from local oscillation module 74 to produce a down-converted analog signal to a filter/gain module 102. Filter/gain module 102 then produces a filtered and/or amplified down-converted signal to an analog-to-digital converter 106. An ingoing digital signal is then produced to baseband processor 54 for processing. Thus, a more accurate oscillation is provided to both the up-conversion and the down-conversion modules 66 and 98 to support desired communication channel operations.

Figure 3:
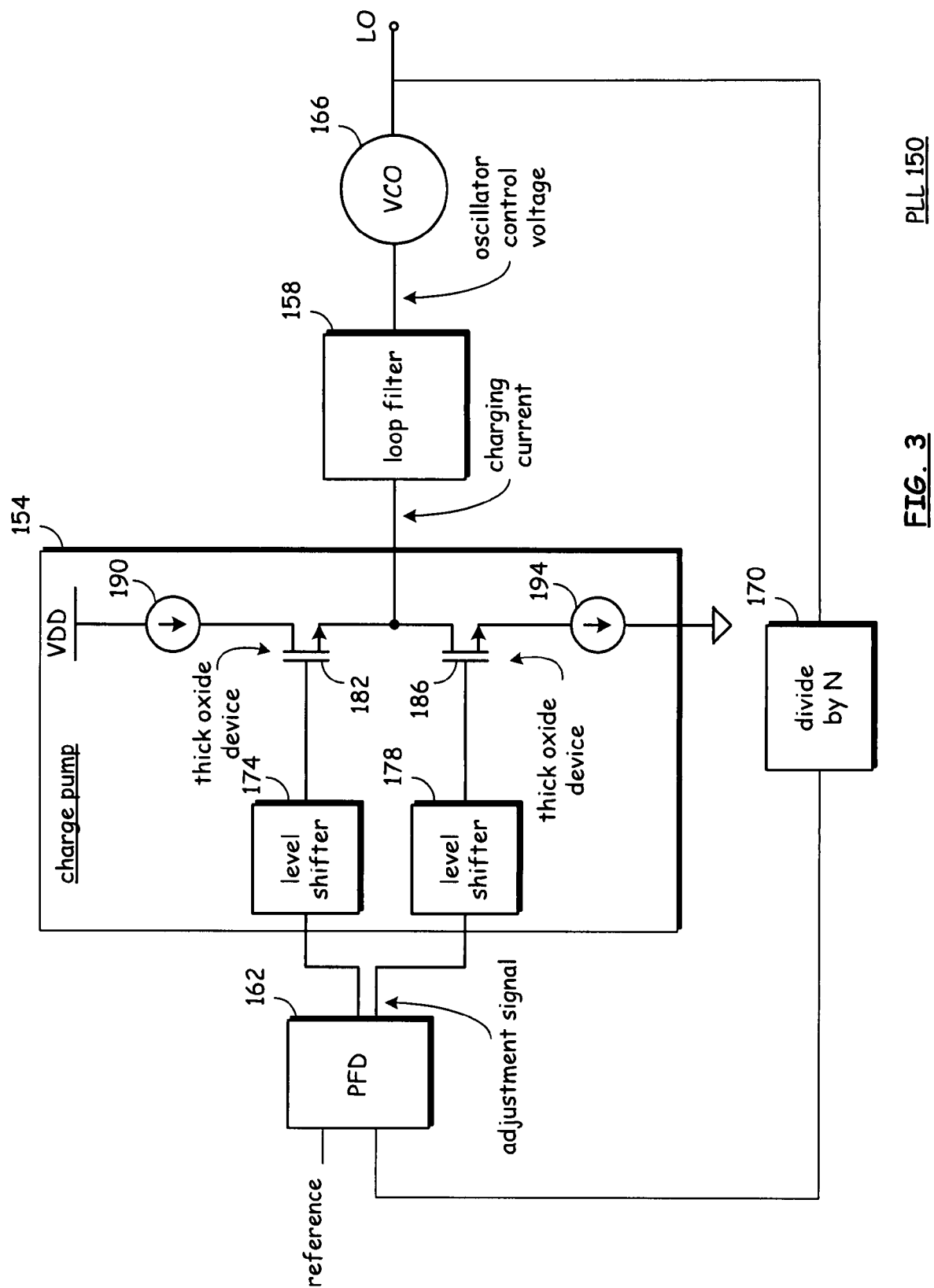
FIG. 3 is a functional schematic diagram of a level shifter in a Phase-Locked Loop according to one embodiment of the invention.

FIG. 3 is a functional schematic diagram of a phase-locked loop (PLL) 150 according to one embodiment of the invention. Phase-locked loop 150 includes a charge pump 154 that produces a charging current to a loop filter 158 based upon an adjustment signal produced by a phase-frequency detector 162. Loop filter 158 produces an oscillator control voltage to voltage controlled oscillator 166 based upon the charging current. Oscillator 166 produces a local oscillation (LO) based upon the oscillator control voltage. Phase-frequency detector 162 is operably disposed to receive a feedback signal that is compared to a reference signal to produce the adjustment signal. In one embodiment, the feedback signal is a divided local oscillation produced by a divide by N block 170 which is coupled to receive the local oscillation to produce the feedback signal. The local oscillation may be divided by an integer or by a fractional amount.

Examining FIG. 3 in greater detail, it may be seen that the adjustment signal is produced by phase-frequency detector 162 to level shifters 174 and 178. Level shifters 174 and 178 are operable to receive the adjustment signal, which is characterized by a first magnitude, and to produce a modified adjustment signal characterized by a second magnitude which is greater than the first magnitude. For example, in one embodiment, the adjustment signal has a 1.2 volt magnitude while the modified adjustment signal has a 2.5 volt magnitude.

The modified adjustment signals are produced from level shifters 174 and 178 to MOSFETs 182 and 186 to selectively bias MOSFETs 182 and 186 into an operational state to selectively couple current sources 190 and 194 to an output node of the charge pump from which the charging current is produced to loop filter 158. When an adjustment signal is produced to MOSFET 182, current source 190 is operably coupled to source current into the output node to provide a charging current to loop filter 158. When an adjustment signal is produced to MOSFET 186, current source 194 is operably coupled to sink current from the output node to provide a charging current to loop filter 158.

In general, when a charging current is provided by current source 190 to loop filter 158, the stored charge within loop filter 158 increases to increase the oscillator control voltage and, therefore, the frequency of the local oscillation produced by voltage controlled oscillator 166. When a charging current is provided by current source 194 (a current is drawn from the output of charge pump 154), the charging current operably removes charge from loop filter 158 to reduce the oscillator control voltage and a corresponding frequency of the local oscillation.

In the described embodiment, MOSFETs 182 and 186 are thick oxide devices formed within the first MOSFET library 82 that are operably disposed into the illustrated circuitry of FIG. 3 through traces similar to traces 78 of FIG. 2. Because MOSFETs 182 and 186 are thick oxide devices, the required threshold voltage to bias the MOSFETs into an operational state is substantially higher than is required for the devices of the second MOSFET library 90. The modified adjustment signal produced by level shifters 174 and 178, therefore, has a magnitude that is greater than or equal to the threshold voltage that is required to operably bias MOSFETs 182 and 186.

Excluding level shifters 174 and 178, the charge pump 154 circuitry that is shown is intended to represent a traditional charge pump. It should be understood that the charge pump circuitry may readily be modified to any other charge pump design that operably sinks or sources current to create the charging current. Thus, any charge pump design that includes thick oxide device that is driven by level shifting circuitry is within scope of the teachings of the present invention. Thus, the teachings of the present invention are, therefore, not intended to be limited to the specific charge pump configuration shown herein FIG. 3.

Figure 4:
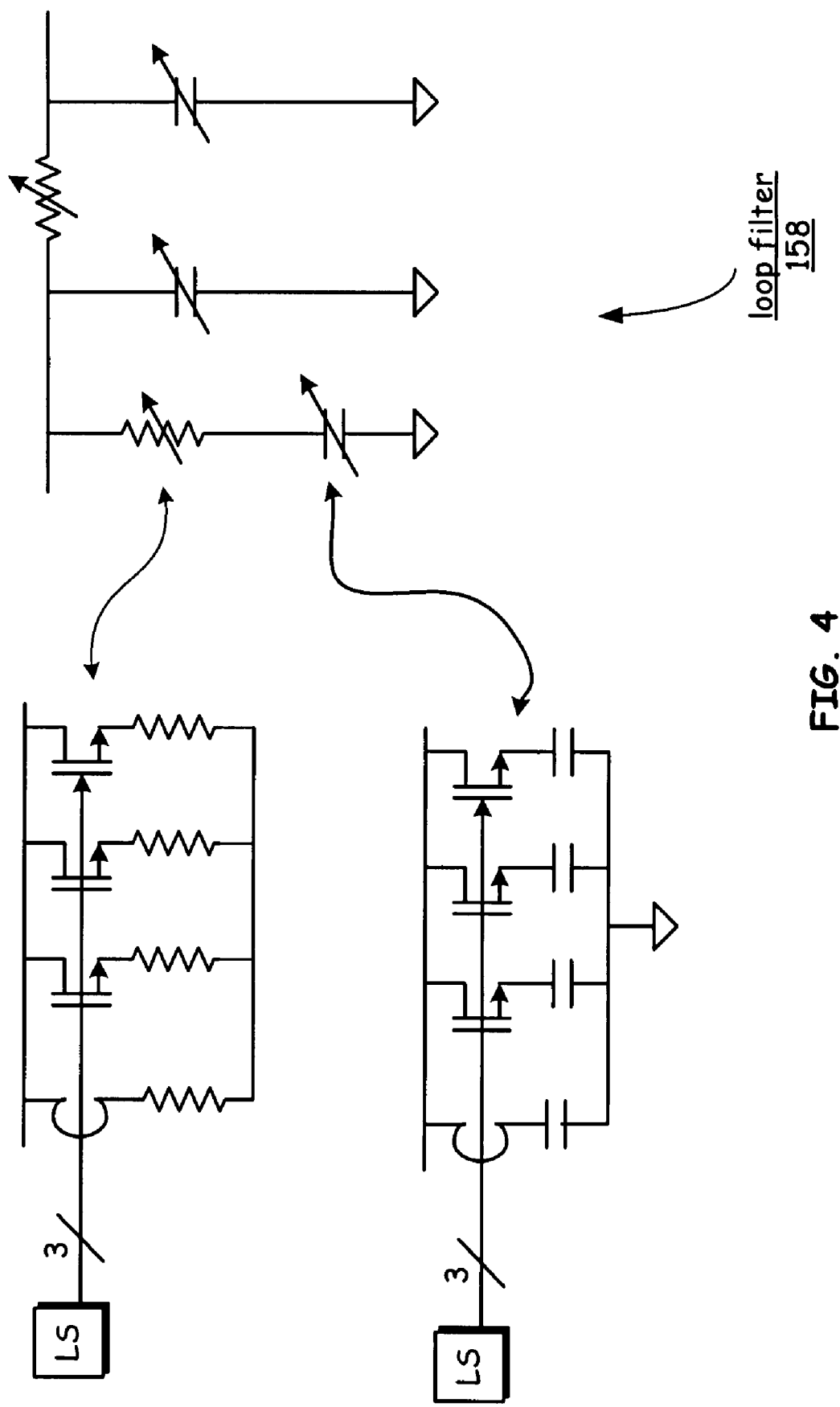
FIG. 4 is a functional schematic diagram of loop filter formed according to one embodiment of the invention.

FIG. 4 is a functional schematic diagram of loop filter 158 formed according to one embodiment of the invention. Generally, loop filter 158 comprises a plurality of resistive and capacitive elements configured to store a charge to produce the oscillator control voltage based upon a charging current. One particular configuration of loop filter 158 is shown in which the capacitive and resistive elements are adjustable. In the described embodiment, both of the individual capacitive and resistive elements shown each include a plurality of parallel coupled capacitive and resistive elements, respectively, that are each coupled in series with a switch to allow the corresponding device to be switched in and out of connectivity. For example, a single adjustable capacitive element of loop filter 158 may actually comprise at least one non switched capacitive element that is operably disposed in parallel with one or more capacitive elements that may each be selectively switched into connectivity by a corresponding series coupled switch.

Specifically, up to three capacitive elements may be switched to be coupled in parallel with a non-selectable (non-switched) capacitive element in the described embodiment though more or less may be utilized. Similarly, in the described embodiment, up to there resistive elements may be switched to be coupled in parallel with a non-selectable (non-switched) resistive element. As the capacitive elements are switched into connectivity, the total capacitance of the selectable capacitive element increases. As the resistive elements are switched into connectivity, the total resistance of the selectable resistive element decreases. Other configurations may be used in which, for example, total capacitance decreases and total resistance increases as corresponding capacitive and resistive elements are switched into connectivity.

As may further be seen, a level shifter is shown with three output lines (one for each switch) to operably couple capacitive elements and a level shifter is shown with three output lines (one for each switch) to operably couple resistive elements. It should be understood that the illustrated level shifter may comprises three separate level shift modules that each produce one of the output lines for selectively biasing a corresponding switch. Each capacitive and resistive element shown may be formed similarly. One substantial point, however, is that the switches used to selectively couple capacitive and resistive elements are thick oxide gate MOSFET devices that formed to be relatively thicker than common MOSFET devices used throughout most of the integrated circuit wireless transceiver (according to the submicron process type) and therefore require a higher bias voltage to operatively bias the devices into an operational state.

Figure 5:
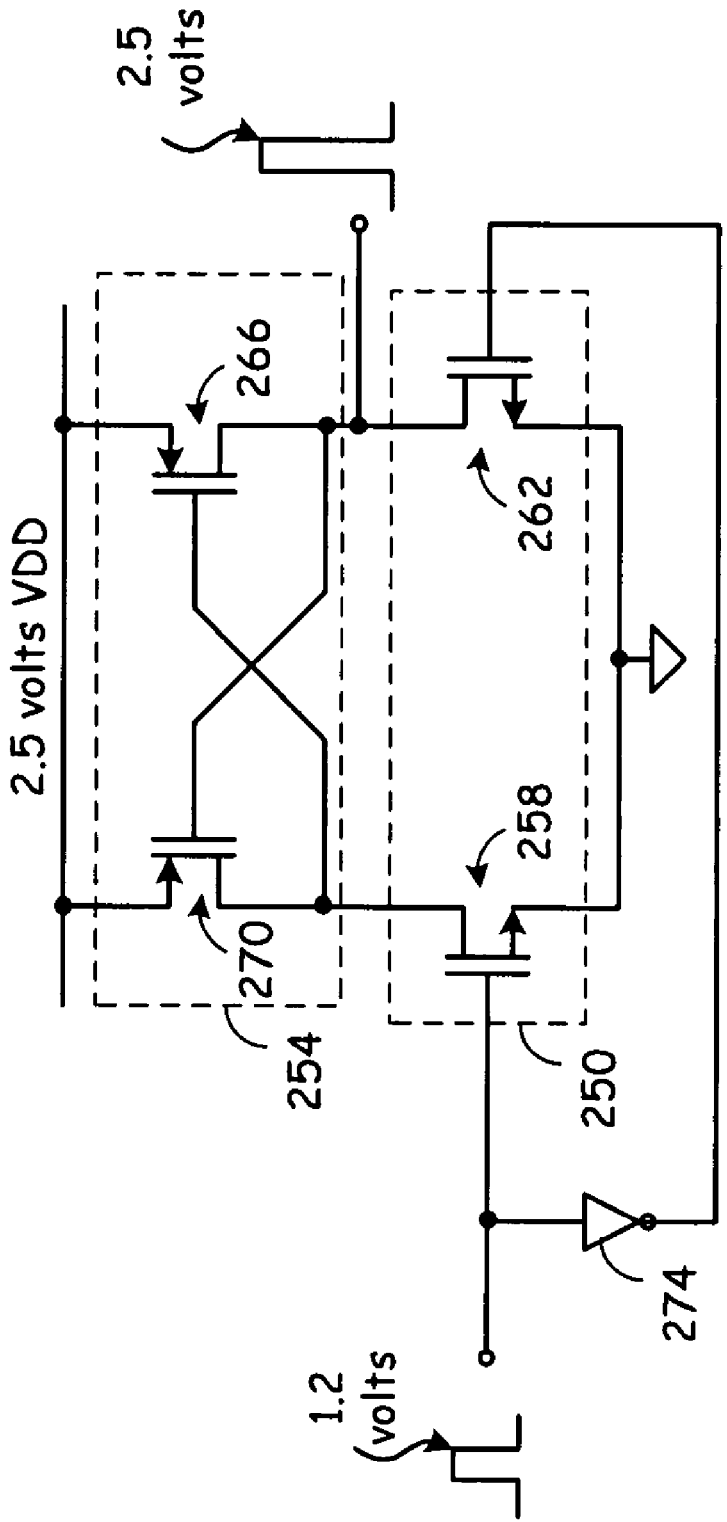
FIG. 5 is a functional schematic diagram of a level shifter according to one embodiment of the invention.

FIG. 5 is a functional schematic diagram of a level shifter 174-178 according to one embodiment of the invention. The level shifters provide an increased signal to operably bias the corresponding thick oxide gate switch. In one specific embodiment, the thick oxide gate devices are 0.28 micron devices and have a correspondingly thicker gate s in comparison the 0.065 micron devices that are used within the integrated circuit wireless transceiver for most common applications. Generally, the level shifter of FIG. 5 may be used for any level shifter shown in the present disclosure. Level shifter 174-178 is operable to produce an outgoing pulse having an increased magnitude in relation to an ingoing pulse. In the specific embodiment, level shifter 174-178 produces a 2.5 volt pulse as long as a 1.2 volt pulse is present at the input of level shifter 174-178. In the described embodiment, each of the MOSFETs shown, (PMOS and NMOS) are thick gate oxide devices formed within the first MOSFET library 82 of FIG. 2 and have a threshold voltage of 0.7 volts. Accordingly, as long as an input pulse is greater than or equal to 0.7 volts, a corresponding output pulse of 2.5 volts is produced based upon the input pulse presented at the input of level shifter 174-178.

For exemplary purposes, the thin oxide gate devices of the second MOSFET library have a threshold voltage of 0.4 volts in one embodiment of the invention. Because the second MOSFET library devices are most commonly used within the integrated circuit transceiver, the logic that generates the adjustment signal (the 1.2 volt pulse) is driven by a supply voltage VDD of 1.2 volts. Accordingly, the output pulses of the adjustment signal are 1.2 volt pulses. As may be seen, the level shifter of FIG. 5 is a relatively simple level shifter that produces a 2.5 volt pulse based upon a 2.5 volt supply and based upon the received 1.2 volt adjustment signal.

More specifically, level shifter 174-178 comprises an input stage 250 that is operable to turn on an output stage 254 upon receiving an input signal that exceeds a threshold voltage of the MOSFETs of the input stage. As may be seen, input stage 250 includes two NMOS devices 258 and 262. Output stage 254 includes, in the described embodiment, two PMOS devices 266 and 270 having cross coupled gates connected as shown. Additionally, an inverter 274 is operably disposed between an input node coupled to the gate of MOSFET 258 and the gate of MOSFET 262.

In operation, an input pulse that exceeds the threshold voltage of MOSFET 258 turns MOSFET 258 on which, in turn, pulls the gate of MOSFET 266 to ground to turn on MOSFET 266. Because MOSFET 266 is on, the output node (drain of MOSFET 266) rises to match VDD thereby producing the output pulse of 2.5 volts as long as MOSFETs 258 and 266 are on. Conversely, when the input pulse is not present or asserted, inverter 274 produces a logic 1 to the gate of MOSFET 262 to turn on MOSFET 270 in a similar fashion to the drain of MOSFET 258. Because MOSFET 258 is off, however, MOSFET 266 is off and the output pulse of the level shifter is a logic 0 relative to the 2.5 volt logic 1. Based on circuit topologies, the logic "0" may or may not be equal to 0 volts.

Figure 6:
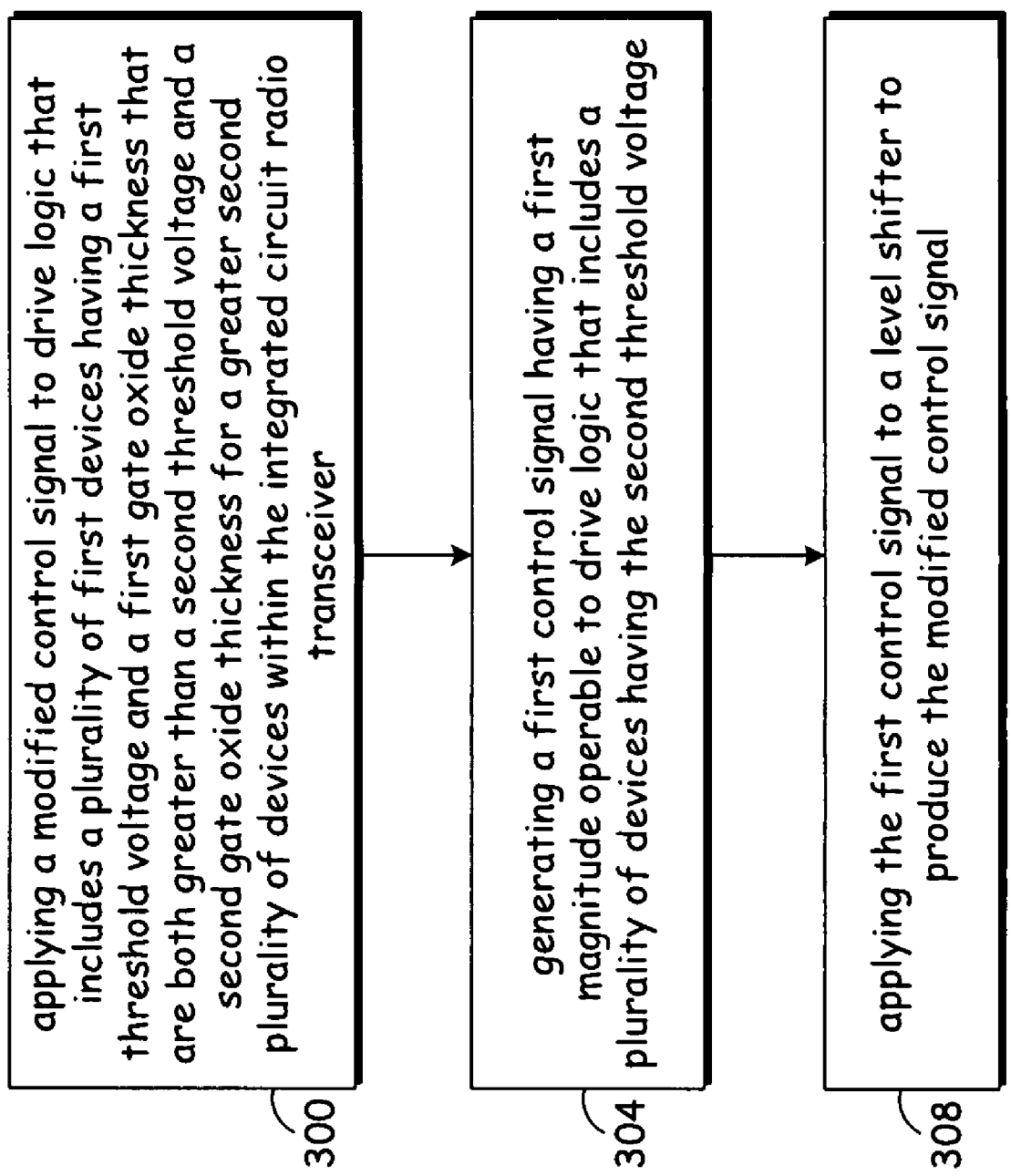
FIGS. 6 and 7 are flow charts that illustrate operation according to one or more embodiments of the invention.
Figure 7:
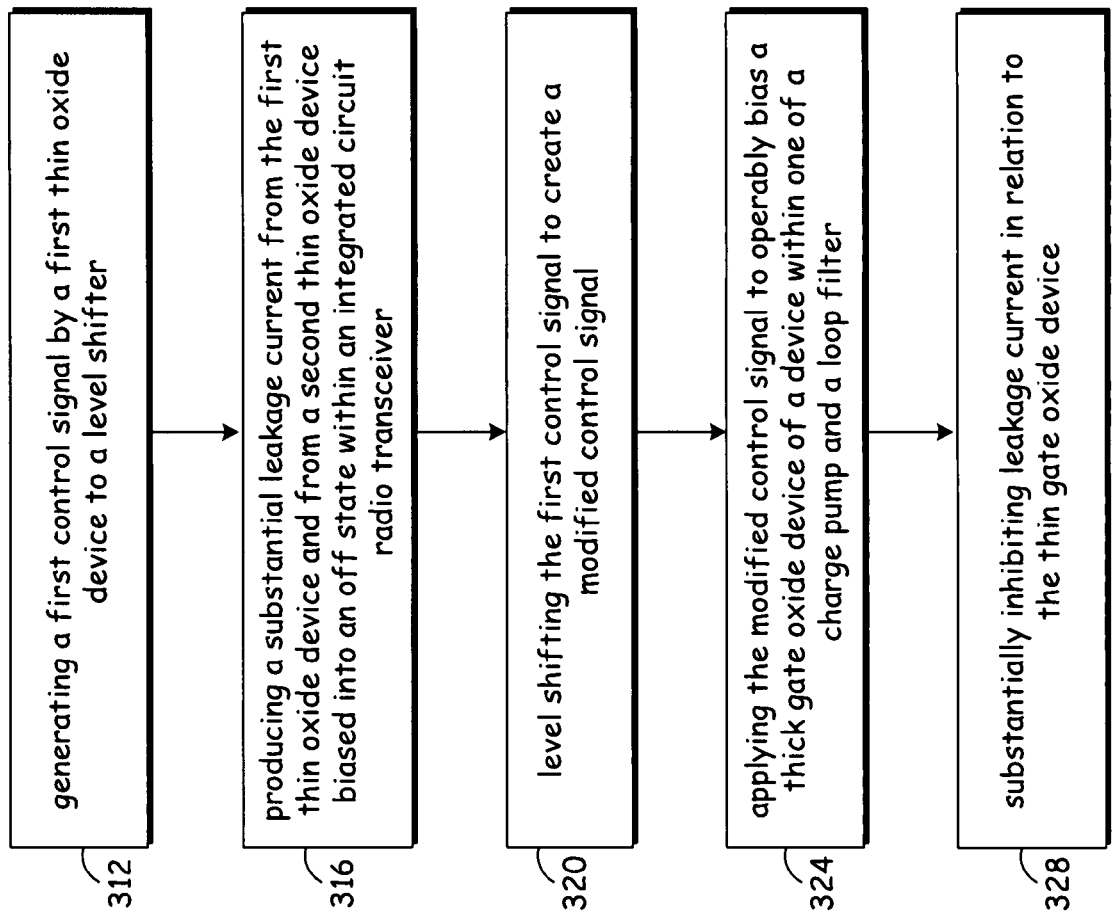

FIGS. 6 and 7 are flow charts that illustrate operation according to one or more embodiments of the invention. One step shown in FIG. 6 is applying a modified control signal to drive logic that includes a plurality of first devices having a first threshold voltage and a first gate oxide thickness that are both greater than a second threshold voltage and a second gate oxide thickness for a greater second plurality of devices within the integrated circuit radio transceiver (step 300). The method also includes generating a first control signal having a first magnitude operable to drive logic that includes a plurality of devices having a second threshold voltage (step 304). The method also includes, to facilitate step 300, applying the first control signal to a level shifter to produce the modified control signal (step 308).

In FIG. 7, one step is applying a first control signal generated by a first thin oxide device to a level shifter (step 312). The method further includes producing a substantial leakage current from the first thin oxide device and from a second thin oxide device within an integrated circuit radio transceiver (step 316). Generally, step 316 relates to the leakage current that is produced by thin gate oxide devices through out the integrated circuit radio transceiver.

The method further includes level shifting the first control signal to create a modified control signal (step 320) and applying the modified control signal to operably bias a thick gate oxide device of a device within one of a charge pump and a loop filter (step 324). Finally, the method includes, because a thick gate oxide device is being used to prevent leakage, substantially inhibiting leakage current in relation to the thin gate oxide device (step 328) when the device is biased into an "off" state.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. An integrated circuit radio transceiver, comprising:
   baseband processor for processing ingoing and outgoing digital communication signals;
   transmitter front end for processing and transmitting outgoing RF signals based upon the outgoing digital communication signals;
   receiver front end for receiving ingoing RF signals and for processing the ingoing RF signals to produce the ingoing digital communication signals; and
   phase locked loop circuitry operable to provide a local oscillation to at least one of the transmitter and receiver front ends to support up-conversion to RF and down-conversion from RF, respectively, the phase locked loop circuitry further including:
      a voltage controlled oscillator operable to produce an oscillation characterized by a specified frequency signal;
      a phase-frequency detector operable to compare a feedback signal based upon the oscillation to a reference signal to produce an adjustment signal;
      a charge pump operable to produce a charging current based upon the adjustment signal;
      a loop filter operable to produce an oscillator control voltage to the voltage controlled oscillator based upon the charging current;
      wherein at least one of the charge pump and the loop filter comprise a first MOSFET switch having a first gate oxide thickness that requires a first threshold voltage to bias the first MOSFET on;
   wherein the integrated circuit radio transceiver comprises a library of second MOSFET devices having a second gate oxide thickness and require a second threshold voltage to bias the second MOSFETs on, wherein a quantity of the second MOSFET devices of the library that are used within the integrated circuit radio transceiver is much greater than a quantity of the first MOSFET devices; and
   wherein the first gate oxide thickness is greater than the second gate oxide thickness and wherein the first threshold voltage is greater than the second threshold voltage.

2. The integrated circuit radio transceiver of claim 1 further comprising a level shifter operable to produce a modified control signal characterized by a first voltage level based upon a received second control signal characterized by a second voltage level wherein the received second control signal is produced by circuitry that includes the second MOSFET devices having gates of the second thickness, and wherein the modified control signal is produced to at least one first MOSFET switch having the first gate oxide thickness.

3. The integrated circuit radio transceiver of claim 1 further comprising a level shifter operable to produce a modified control signal having a signal magnitude that exceeds the first threshold voltage and is based upon a received second control signal, the second control signal having a signal magnitude that is less than the modified control signal, wherein the modified control signal is produced to at least one first MOSFET switch having the first gate oxide thickness.

4. The integrated circuit radio transceiver of claim 1 wherein first MOSFET switch is a switching device for a charge pump of the phase-locked loop circuitry.

5. The integrated circuit radio transceiver of claim 1 wherein first MOSFET switch is a switching device for a loop filter of the phase-locked loop circuitry.

6. An integrated circuit radio transceiver, comprising:
   front end circuitry for transmitting outgoing radio frequency signals and for receiving ingoing radio frequency signals;
   at least one first MOSFET switch that is used in a switching application of the integrated circuit transceiver having a thicker gate oxide;
   a library of components that includes second MOSFET switches that are used in circuitry of the integrated circuit radio transceiver wherein the circuitry is operable to produce output signals that are less than or equal to a first voltage magnitude based upon input signals that are less than or equal to the first voltage magnitude; and
   a level shifter operable to receive a control signal having the first voltage magnitude and generated within the circuitry of the integrated circuit radio transceiver, the level shifter operable to produce a modified control signal having a second voltage magnitude based upon the received control signal.

7. The integrated circuit radio transceiver of claim 6 wherein the second voltage magnitude is greater than the first voltage magnitude.

8. The integrated circuit radio transceiver of claim 7 wherein the second voltage magnitude exceeds a threshold voltage of the first MOSFET and further wherein the modified control signal is operable to switch the first MOSFET to an ON state when applied to the first MOSFET.

9. The integrated circuit radio transceiver of claim 8 further including phase locked loop circuitry operable to provide a local oscillation to radio front end to support at least one of up-conversion to RF and down-conversion from RF without reference spurs.

10. The integrated circuit radio transceiver of claim 9 wherein the phase locked loop circuitry further includes a voltage controlled oscillator operable to produce an oscillation characterized by a specified frequency signal.

11. The integrated circuit radio transceiver of claim 9 wherein the phase locked loop circuitry further includes:
   a phase-frequency detector operable to compare a feedback signal based upon the oscillation to a reference signal to produce an adjustment signal;
   a loop filter operable to produce a voltage signal to the voltage controlled oscillator based upon the adjustment signal; and
   wherein at least one of the phase-frequency detector and the loop filter further comprise the first MOSFET switch.

12. The integrated circuit radio transceiver of claim 11 wherein the first MOSFET has a first gate oxide thickness that requires a first threshold voltage to bias the first MOSFET on wherein the first gate oxide thickness is greater than a second gate oxide thickness of the second MOSFETs of the library of components.

13. A method in an integrated circuit radio transceiver, comprising:
   applying a modified control signal to drive logic that includes a first plurality of first devices having a first threshold voltage and a first gate oxide thickness that are both greater than a second threshold voltage and a second gate oxide thickness for a greater second plurality of second devices within the integrated circuit radio transceiver;
   generating a first bias signal having a first magnitude operable to drive logic that includes a plurality of the second devices having the second threshold voltage; and
   applying a first control signal having a magnitude equal to or less than the first bias signal to a level shifter to produce the modified control signal.

14. The method of claim 13 further including generating the first control signal based on a first supply voltage level.

15. The method of claim 13 further including generating the first control signal using at least one of the second plurality of devices.

16. The method of claim 13 further including generating the modified control signal using at least one of the first plurality of devices.

17. The method of claim 13 further including switching a current source of a charge pump into and out of connectivity to an output of the charge pump using at least one device of the first plurality of devices.

18. The method of claim 13 further including switching a capacitive element of a loop filter into and out of connectivity to modify a charge rate of the loop filter using at least one device of the first plurality of devices.

19. A method for generating a local oscillation in a phase-locked loop that includes a charge pump and a loop filter coupled in series, the method comprising:
   generating a first control signal using a thin gate oxide device, wherein the thin oxide gate device, when biased in an off state, produces a substantial leakage current;
   applying the first control signal to a level shifter;
   level shifting the first control signal to create a modified control signal; and
   applying the modified control signal to operably bias a thick gate oxide device of a device within one of the charge pump and the loop filter.

20. The method of claim 19 wherein the thick gate oxide device, when biased in an off state, substantially inhibits leakage current in relation to the thin gate oxide device.

* * * * *